(12) United States Patent
Li et al.

(10) Patent No.: US 11,232,903 B2
(45) Date of Patent: Jan. 25, 2022

(54) ADDITIVE MANUFACTURE OF ANISOTROPIC RARE EARTH MAGNETS

(71) Applicant: Ford Global Technologies, LLC, Dearborn, MI (US)

(72) Inventors: Wanfeng Li, Novi, MI (US); Feng Liang, Troy, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 349 days.

(21) Appl. No.: 16/139,952

(22) Filed: Sep. 24, 2018

(65) Prior Publication Data

US 2020/0094321 A1    Mar. 26, 2020

(51) Int. Cl.
| | | |
|---|---|---|
| *H01F 41/02* | (2006.01) | |
| *B22F 10/20* | (2021.01) | |
| *B22F 10/28* | (2021.01) | |
| *B22F 10/30* | (2021.01) | |
| *H01F 7/02* | (2006.01) | |

(Continued)

(52) U.S. Cl.
CPC .......... *H01F 41/0273* (2013.01); *B22F 10/20* (2021.01); *B22F 10/28* (2021.01); *H01F 1/053* (2013.01); *H01F 7/02* (2013.01); *H01F 41/0253* (2013.01); *H01F 41/0293* (2013.01); *B22F 10/30* (2021.01); *B22F 2203/11* (2013.01); *B22F 2301/20* (2013.01); *B22F 2301/355* (2013.01); *B22F 2301/45* (2013.01); *C22C 38/005* (2013.01); *C22C 2202/02* (2013.01)

(58) Field of Classification Search
CPC .............. B22F 3/1055; B22F 2301/155; B22F 2301/355; B22F 2301/45; B22F 2203/11; B22F 3/105–0154; H01F 1/04; H01F 1/047; H01F 1/053; H01F 1/0575; H01F 1/0577; H01F 1/06; H01F 1/08; H01F 1/086; H01F 1/0536; H01F 1/057–0579; H01F 7/02; H01F 41/0253; H01F 41/0273; H01F 41/0293; C22C 38/005; C22C 2202/02

See application file for complete search history.

(56) References Cited

U.S. PATENT DOCUMENTS

2002/0158534 A1* 10/2002 Fukunaga ............... H01F 1/057
                                                                310/156.08
2015/0273631 A1    10/2015 Kenney et al.
(Continued)

OTHER PUBLICATIONS

Intelligent Materials, "Specification Sheet—Neodymium Iron Boron Magnetic Powders" (Mar. 2017). (Year: 2017).*
(Continued)

*Primary Examiner* — Anthony J Zimmer
*Assistant Examiner* — Dean Mazzola
(74) *Attorney, Agent, or Firm* — David B. Kelley; Brooks Kushman P.C.

(57) ABSTRACT

A method includes depositing a layer of alloy particles including rare earth permanent magnet phase above a substrate, laser scanning the layer while cooling the substrate to melt the particles, selectively initiate crystal nucleation, and promote columnar grain growth in a same direction as an easy axis of the rare earth permanent magnet phase. The method also includes repeating the depositing and scanning to form bulk anisotropic rare earth alloy magnet with aligned columnar grains.

13 Claims, 2 Drawing Sheets

(51) Int. Cl.
*H01F 1/053* (2006.01)
*C22C 38/00* (2006.01)

(56) References Cited

U.S. PATENT DOCUMENTS

2016/0307678 A1    10/2016    Unosson et al.
2017/0154713 A1*    6/2017    Simon .................. B23K 26/342

OTHER PUBLICATIONS

Harada, Tetsuji et al. Structures and Magnetic Properties of a Nd15Fe77B8 Alloy Produced by Twinroller Quenching. Department of Materials Science and Engineering, Massachusetts Institute of Technology, Cambridge Massachusetts. Jun. 15, 1990. 7 pages.
Dadon, D et al. The Texture of Melt Spun Fe76Nd16B8 Ribbons. IEEE Transactions on Magnetics, vol. Mag-23, No. 5, Sep. 1987. 2 pages.

* cited by examiner

ADDITIVE MANUFACTURE OF ANISOTROPIC RARE EARTH MAGNETS

TECHNICAL FIELD

This disclosure relates to the manufacture of magnets.

BACKGROUND

Neodymium iron boride magnets have been widely used in all kinds of applications, such as hard disks, wind turbines, motors, and generators. Driven by growing green energy applications, demands for these magnets have been rapidly increasing. Conventionally, neodymium iron boride magnets are produced by sintering and hot deformation. Both techniques involve several steps from raw material preparation to the final product. Normally bulk magnets are prepared and need to be cut into desired shape and size for the specified applications. This processing procedure can create a large amount of waste. As the waste contains expensive rare earth element, they cannot be simply disposed of. Recycling of rare earth elements from the waste is another complex procedure, and may be costly

SUMMARY

A method includes depositing a layer of alloy particles including rare earth permanent magnet phase above a substrate, laser scanning the layer while cooling the substrate to melt the particles, selectively initiate crystal nucleation, and promote columnar grain growth in a same direction as an easy axis of the rare earth permanent magnet phase, and repeating the depositing and scanning to form bulk anisotropic rare earth alloy magnet with aligned columnar grains. The method may further include diffusing rare earth alloy onto opposite ends of the bulk anisotropic rare earth alloy magnet. The laser scanning may be selective laser melting. The laser scanning may heat the particles to a temperature between 1200° C. and 1400° C. The cooling may be at a rate between 100° C./s and 10000° C./s. The alloy particles may include RE-Fe—B. The alloy particles may include Ce, Dy, La, Pr, or Tb. The alloy particles may include one or more refractory elements. The substrate may be curved. The substrate may be an anisotropic rare earth magnet substrate.

A magnet structure includes columnar grains of rare earth permanent magnet phase aligned in a same direction and arranged to form bulk anisotropic rare earth alloy magnet having a boundary defined by opposite ends of the columnar grains and lacking triple junction regions. The rare earth permanent magnet phase may be RE-Fe—B. The rare earth permanent magnet phase may include Ce, Dy, La, Pr, or Tb.

A magnet structure includes a plurality of rare earth alloy layers arranged one on top of the other to form bulk anisotropic rare earth alloy magnet that lacks triple junction regions. Each of the layers is defined by columnar grains having opposite ends that define boundaries of the layer. The columnar grains of all of the layers are aligned along a same axis.

A method includes depositing a layer of alloy particles including rare earth magnet phase above a surface of a transition metal substrate having lattice parameters matching basal plane parameters of the rare earth magnet phase, laser scanning the layer while cooling the substrate to melt the particles and promote same direction columnar grain growth, and repeating the depositing and scanning to form bulk anisotropic rare earth alloy magnet having aligned columnar grains and lacking triple junction regions. The transition metal substrate may be tantalum. The method may further include diffusing a rare earth alloy onto opposite ends of the bulk anisotropic rare earth alloy magnet. The laser scanning may be selective laser melting. The alloy particles may be RE-Fe—B particles. The alloy particles may include Ce, Dy, La, Pr, or Tb. The alloy particles may include one or more refractory elements.

Methods herein can also be used to make anisotropic powders with grains in the powders aligned, i.e. forming columnar grains along easy direction.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Development of additive manufacturing provides new opportunities to improve the processing techniques of rare earth based permanent magnets. Additive manufacturing can not only improve the efficiency and decrease the waste during magnet production by producing net shape or near net shape magnets; it may also improve the performance of the magnet with more flexibility over the control of processing parameters. In particular, the metallic additive manufacturing which can be used to prepare fully dense Nd—Fe—B without any binder is more promising in the production of Nd—Fe—B magnet.

For metallic additive manufacturing, the material powders are melted by laser or electron beam and solidified to form desired shape bulk materials. The fundamental principle behind this technique is basically the same as that of more conventional solidification techniques, and the mechanism governing the microstructure and properties are also similar.

Considering the melting point, thermal, and electrical conductivity of Nd—Fe—B magnets, it is feasible to synthesize bulk Nd—Fe—B magnets by all sorts of melting and solidification techniques. Even anisotropic magnet can be prepared by directional solidification, a technique that has been widely used in the production of jet engine blades. The major problem with Nd—Fe—B magnet prepared using these techniques is the lower performance. Especially, the coercivity of the magnet tends to be much lower than the sintered and hot deformed ones due to much larger grain sizes.

Figure 1:
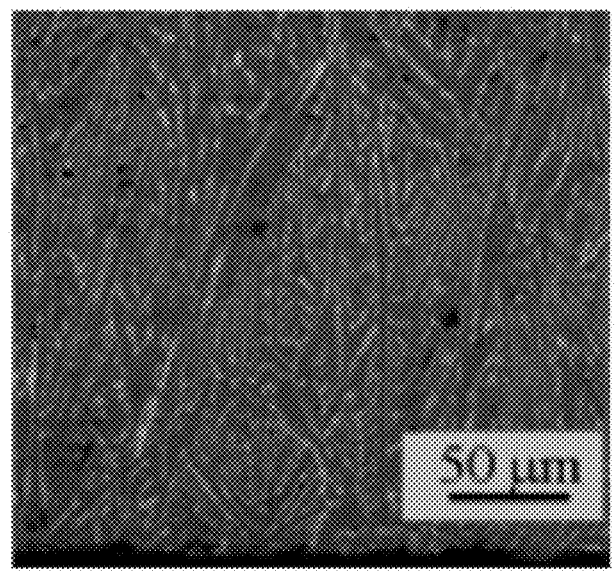
FIG. 1 is an image of $Nd_2Fe_{14}B$ phase microstructure showing formation of columnar grains under controlled cooling rates.

Coercivity is governed by two factors: anisotropy field of the hard phase, and the microstructure of the magnet. The anisotropy field of the $Nd_2Fe_{14}B$ phase is of the same value as far as the composition and crystal structure are the same, and the major problem of low coercivity is the microstructure, including grain size, shape and homogeneity. Modulating the microstructure to achieve higher coercivity is also a major topic in the past three decades in the development of rare earth based permanent magnet. For example, melt spun Nd—Fe—B ribbon from rapid solidification by spraying liquid Nd—Fe—B alloys onto rotating Cu wheels can have much higher coercivity than that of sintered Nd—Fe—B magnet with the same composition. By strip casting, a technique similar to melt spinning with lower cooling rate, anisotropic grain growth of $Nd_2Fe_{14}B$ phase can be achieved. As shown in FIG. 1, the dark phase is the $Nd_2Fe_{14}B$ with columnar structure, and the longer direction of the columns is parallel with the easy axis of the $Nd_2Fe_{14}B$ phase and perpendicular to the surface of the ribbons. Although such a microstructure is rather favorable for high performance permanent magnet, the colunmnar grains are not perfectly aligned as shown in FIG. 1. The major problem is that the temperature gradient is not unidirectional especially when the ribbons fly away from the Cu wheel, which leads to the misalignment of the grains and also dendrite growth. Another problem is the strip cast alloys are thin and small. Preparation of bulk anisotropic magnet is not possible by this method.

There have been some efforts to synthesize Nd—Fe—B magnet by additive manufacturing. Unlike conventional sintered and hot deformed Nd—Fe—B magnet, all the Nd—Fe—B magnets prepared from additive manufacturing are isotropic. As a result, the performance is much lower than that of the sintered and hot deformed magnet, which also limited the application of additive manufacturing techniques in the production of Nd—Fe—B magnet. The much inferior properties of isotropic magnet prepared by additive manufacturing cancelled the advantages of such processing techniques in materials saving and shape controlling. Therefore, the capability to synthesize anisotropic Nd—Fe—B magnet may be important for application of additive manufacturing in Nd—Fe—B magnet production. With the development of additive manufacturing, combined with alloy design and processing strategy optimization, the microstructure of Nd—Fe—B magnet can be controlled, and much better performance can be achieved. The approach proposed here is to utilize the additive manufacturing technique to control the microstructure, and therefore the magnetic property of Nd—Fe—B magnet. There are different metallic additive manufacturing techniques, the best suited for this purpose is selective laser melting (SLM).

Figure 2:
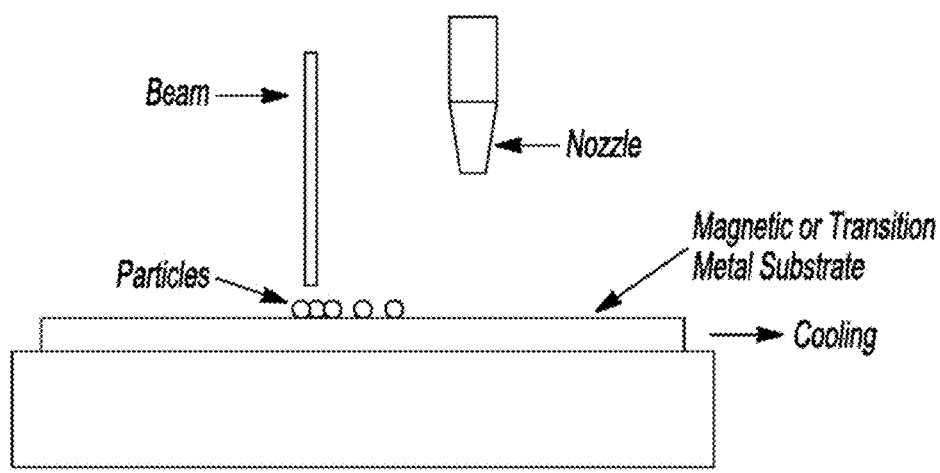
FIGS. 2 and 3 are schematic diagrams of manufacturing arrangements that promote anisotropic grain growth during magnet formation.

For better control over the temperature gradient, and the cooling rate, not only can the power and spot size of the laser beam can be controlled, but the substrate on which the magnet is synthesized should be cooled by circulation water or other method. To induce the anisotropic grain growth, anisotropic Nd—Fe—B magnet with easy axis perpendicular to the surface can be placed on top of the substrate or used directly as the substrate as shown in FIG. 2. Other materials such as tantalum with lattice parameters matching the basal plane parameters of $RE_2Fe_{14}B$ phase can also be used to direct the grain growth.

Figure 3:
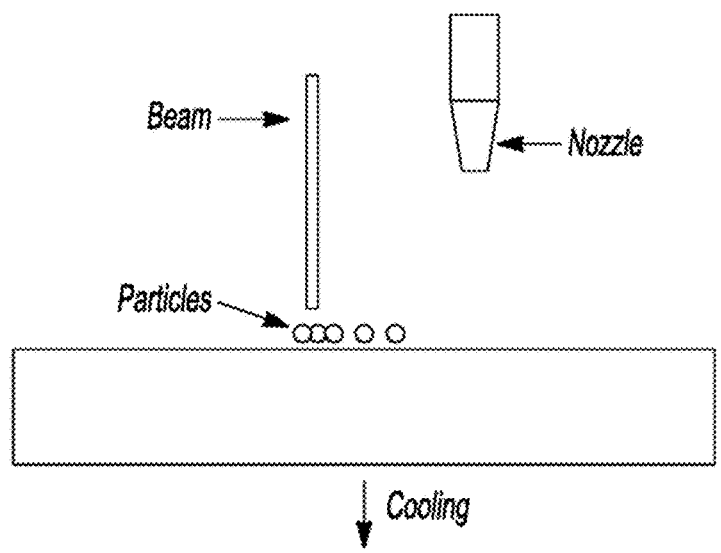

In FIG. 2, the substrate of selected materials is used to induce the anisotropic grain growth of the $Nd_2Fe_{14}B$ grains and to improve the texture, but it is not necessary as anisotropic grain growth can also be achieved by controlling the processing parameters. In such a scenario, the setup is shown in FIG. 3. The substrate surfaces of FIGS. 2 and 3 are shown to be relatively flat. They, however, may also curved or spherical with resulting columnar grains extending radially therefrom. Other arrangements are also possible.

Nd—Fe—B powders prepared from melt spinning, gas atomization, hydrogenation-disproportionation-desorption-recombination, or jet milling can be placed on top of the substrate. Then a laser beam scans the powder layer line by line. To promote the columnar grain growth, temperature gradient control is critical. Unidirectional temperature gradient along the growth direction or the direction perpendicular to the surface of the substrate is ideal but may not be realistic as heat transfer may happen along other directions. Quantitatively, the angle between actual heat flow direction and the in-plane horizontal line can be expressed as $$\cos(\theta) = \frac{\frac{\partial T}{\partial x}}{\sqrt{\left(\frac{\partial T}{\partial x}\right)^2 + \left(\frac{\partial T}{\partial z}\right)^2}}$$

Here, T is temperature, and x and z represent scanning direction and growth direction respectively. Higher scanning speed is helpful to decrease the temperature gradient along the x direction, therefore making the angle θ closer to 90 degrees.

The beam power should be high enough to heat the powder to 1200° C. to 1400° C. during the quick scanning. The powder would be melted together with part of the substrate for the first layer in case that there is a substrate layer. For subsequent layers, each scan would also make the previous layer partially melted. As nucleation of new crystals demands higher energy than growth from the grains of the substrate or the pervious layer, epitaxial grain growth is energetically favorable and anisotropy/texture induced by the substrate and temperature gradient can be achieved.

Figure 4:
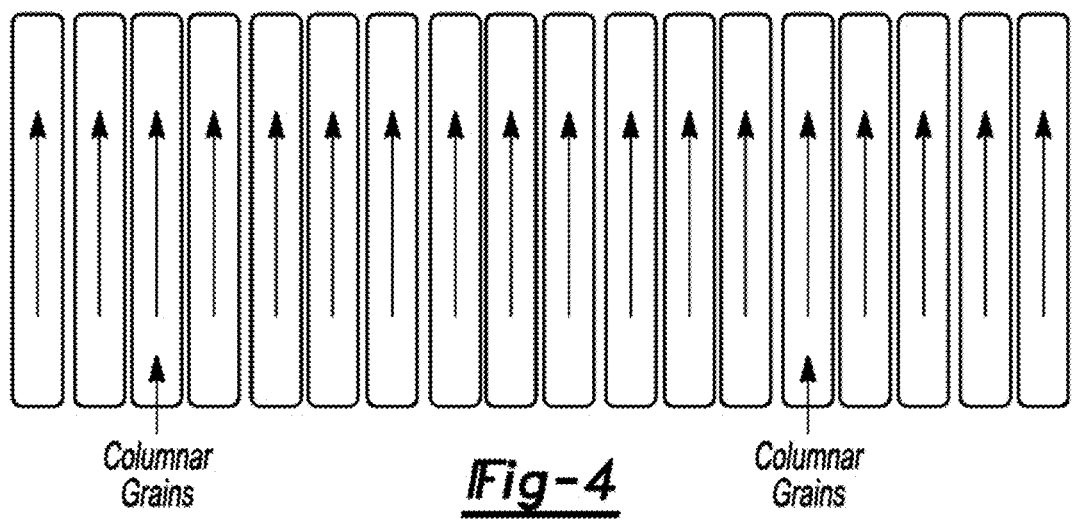
FIG. 4 is a schematic diagram of a magnet with columnar grains.

For columnar grain growth of Nd—Fe—B magnet, the cooling rate should be in the range of about $10^3$° C./s. Finer grains can be achieved by increasing cooling rate. Although decreasing grain size can improve the coercivity of the magnet, too much undercooling leads to nucleation of new grains, which can be potentially detrimental to the texture of the magnet. The cooling rate can be controlled by adjusting scanning speed, laser power, and substrate temperature. The magnet with columnar grains is schematically shown in FIG. 4. The grain size is exaggerated.

Figure 5:
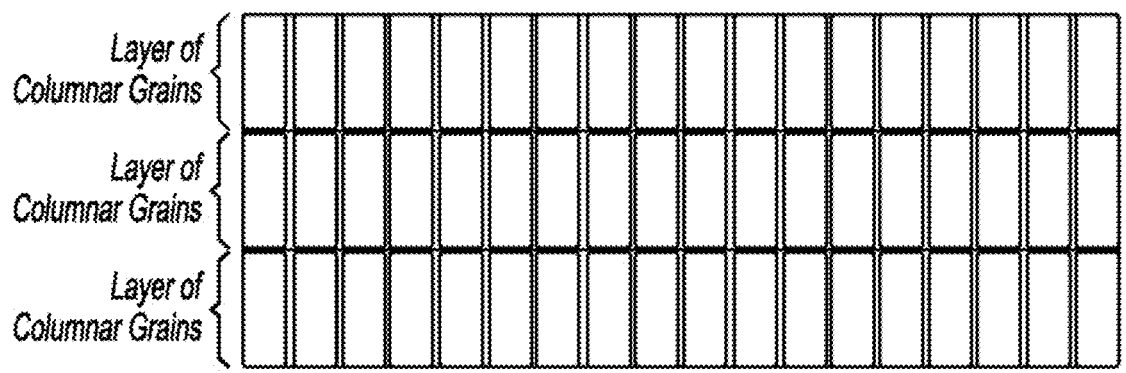
FIG. 5 is a schematic diagram of a magnet with multiple layers of columnar grains.

It is not necessary that each columnar grain grows from the bottom through the top of the magnet. It can also be of multiple layers of columnar grains as shown in FIG. 5. The columnar grain growth can also avoid the formation of triple junction regions, which is common in sintered magnet. The triple junction regions are nonmagnetic and filled with Nd rich phase. It consumes large amounts of expensive Nd but does not contribute to the magnetic properties. The columnar grain growth can also potentially decrease the overall content of Nd and other rare earth elements in the magnet.

As most of the rare earth elements can form the same structure as that of $Nd_2Fe_{14}B$, and the grain growth mechanism is quite similar, the alloys of less expensive rare earth elements, such as Ce and La, or the mixture of these less expensive rare earth elements and other rare earth elements can also be prepared using the same method. Briefly speaking, this method can be used to prepare RE-Fe—B magnet with RE representing rare earth elements, as $Nd_2Fe_{14}B$ is a member of a group of compounds of $RE_2Fe_{14}B$. Here the rare earth elements can be Nd, Pr, Dy, Tb, Ce, La, or any mixture thereof, and Fe can also be partially replaced by elements such as Co, Cu, Al, Ga, Zr, Nb, etc. As all of the RE-Fe—B alloys in a wide range of compositions form the same $RE_2Fe_4B$ compounds, and thermal dynamic behavior for the phase transition is similar, the technique proposed here can be employed to produce magnet of all RE-Fe—B alloys with similar microstructure.

Ce—Fe—B and RE-Fe—B magnet containing the less expensive Ce or La are normally more sensitive to the microstructure, especially the grain size. By additive manufacturing with higher cooling rate, the grain size can be much smaller than that of sintered magnet. Furthermore, the columnar grain shape is also favorable for higher coercivity. Therefore, the coercivity of Ce and La containing RE-Fe—B magnet prepared by this method can also be improved, and this magnet can replace Nd—Fe—B magnet for some applications. This is helpful to decrease the demand for Nd, Pr, Dy, and Tb. Addition of small amounts of refractory elements, such as Ti, Zr, Nb, and Tb, is also helpful to refine the grain structure and to improve the coercivity of the magnet.

Figure 6:
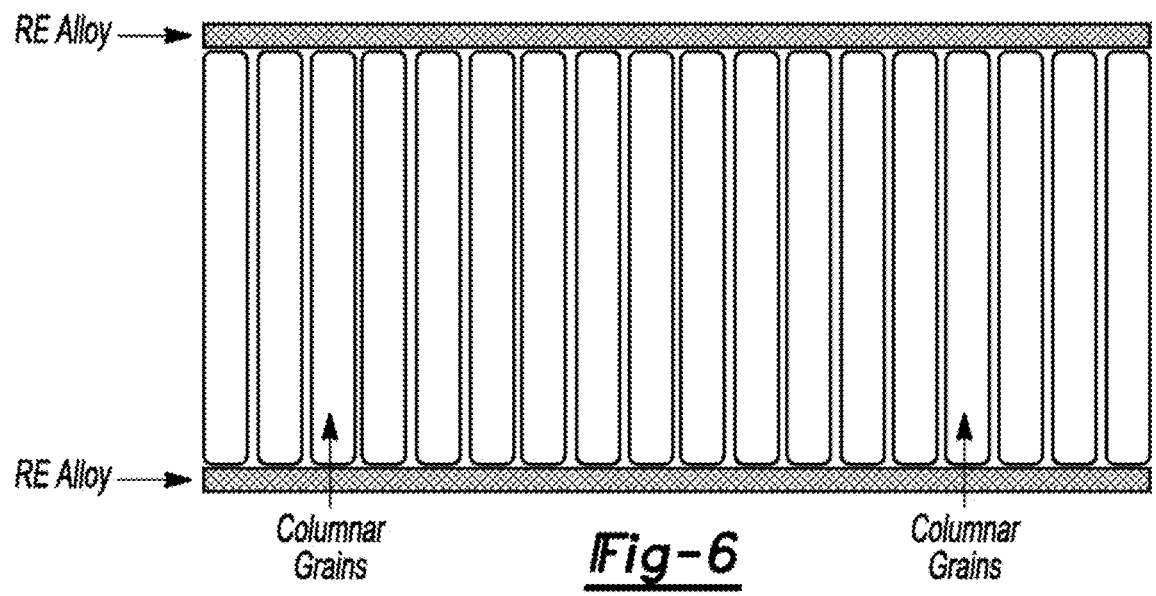
FIG. 6 is a schematic diagram of a magnet with columnar grains and rare earth alloys on top and bottom surfaces thereof.

The coercivity of the magnet prepared using this method can be further improved by grain boundary diffusion/infiltration. The microstructure of the magnet is highly anisotropic with straight grain boundaries along the direction perpendicular to the top surface of the magnet. Atomic diffusion is also highly anisotropic and would be much faster from top to bottom; therefore, different from the grain boundary diffusion procedure of conventional sintered and hot deformed magnet, the alloys for diffusion can be applied on the bottom and top surface of the magnet instead of all the surface of the magnet as shown in FIG. 6. The diffusion procedure would be also much more efficient and could be finished in much shorter duration.

Besides bulk magnets, this processing technique can also be used to make Nd—Fe—B particles with improved performance. Anisotropic particles can be produced by slightly changing the scanning strategy, and also the composition and coercivity can be improved by adding other elements. For example, Nd—Fe—B powders can be mixed with similar alloys for grain boundary diffusion purposes to improve the coercivity of the magnet powders. The high coercivity and anisotropic powders can be used in bounded magnet or other applications.

Thus, methods to produce anisotropic RE-Fe—B bulk magnet and RE-Fe—B magnet powders is proposed using metallic additive manufacturing methods. Anisotropic colunmnar grains can be formed during additive manufacturing with dedicated control of the processing parameters and modification to the setup. Compared with the conventional sintering method, besides savings in raw materials which is common for net shape additive manufacturing, no alignment is needed to achieve anisotropic magnet. Optimized distribution of rare earth elements can further decrease the demand for these expensive materials. Better control over the microstructure enables higher performance.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A method comprising:
depositing a layer of alloy particles including rare earth permanent magnet phase above a substrate;
laser scanning the layer to heat the particles to between 1200° C. and 1400° C. while cooling the substrate at a rate of $10^{3°}$ C./s to melt the particles, selectively initiate crystal nucleation, and promote columnar grain growth in a same direction as an easy axis of the rare earth permanent magnet phase;
repeating the depositing and scanning to form a bulk anisotropic rare earth alloy magnet with aligned columnar grains; and
diffusing rare earth alloy onto opposite ends of the bulk anisotropic rare earth alloy magnet.

2. The method of claim 1, wherein the laser scanning is selective laser melting.

3. The method of claim 1, wherein the alloy particles are RE-Fe—B particles.

4. The method of claim 1, wherein the alloy particles include Ce, Dy, La, Pr, or Tb.

5. The method of claim 1, wherein the alloy particles include one or more refractory elements.

6. The method of claim 1, wherein the substrate is curved.

7. The method of claim 1, wherein the substrate is an anisotropic rare earth magnet substrate.

8. A method comprising:
- depositing a layer of alloy particles including rare earth magnet phase above a surface of a transition metal substrate having lattice parameters matching basal plane parameters of the rare earth magnet phase;
- laser scanning the layer to heat the particles to between 1200° C. and 1400° C. while cooling the substrate at a rate of $10^{3}$° C./s to melt the particles and promote same direction columnar grain growth;
- repeating the depositing and scanning to form a bulk anisotropic rare earth alloy magnet having aligned columnar grains and lacking triple junction regions such that the aligned columnar grains form a single layer and extend from a bottom surface of the bulk anisotropic rare earth alloy magnet, that is melted together with the substrate, through a top surface of the bulk anisotropic rare earth alloy magnet; and
- diffusing a rare earth alloy onto opposite ends of the bulk anisotropic rare earth alloy magnet.

9. The method of claim 8, wherein the transition metal substrate is tantalum.

10. The method of claim 8, wherein the laser scanning is selective laser melting.

11. The method of claim 8, wherein the alloy particles are RE-Fe—B particles.

12. The method of claim 8, wherein the alloy particles include Ce, Dy, La, Pr, or Tb.

13. The method of claim 8, wherein the alloy particles include one or more refractory elements.

\* \* \* \* \*